(12) United States Patent
Remmert

(10) Patent No.: US 6,735,450 B1
(45) Date of Patent: May 11, 2004

(54) METHOD AND APPARATUS FOR WIRELESS OUTDOOR ENVIRONMENT COMMUNICATIONS NETWORKS

(75) Inventor: H. Peter Remmert, Reading (GB)

(73) Assignee: Symbol Technologies, Inc., Holtsville, NY (US)

( * ) Notice: Subject to any disclaimer, the term of this patent is extended or adjusted under 35 U.S.C. 154(b) by 567 days.

(21) Appl. No.: 09/713,907

(22) Filed: Nov. 16, 2000

(51) Int. Cl.⁷ .................................................. H04B 1/38
(52) U.S. Cl. .................... 455/550; 455/67.15; 455/3.02; 455/561; 455/117; 361/688
(58) Field of Search ............................. 455/550.1, 561, 455/117, 67.15, 3.02, 82; 361/688

(56) References Cited

U.S. PATENT DOCUMENTS 6,571,110 B1 * 5/2003 Patton et al. ................ 455/561
2002/0065052 A1 * 5/2002 Pande et al. ................ 455/67.5

OTHER PUBLICATIONS

Remmert, H. Peter, "99–INT–01940/001 2 & 11 MB AP Extreme Temperature Housing", pp. 1–5 (Dec. 26, 1999).
Remmert, H. Peter, "99–INT–01940/002 High Performance Enclosure", pp. 1–11 (Jan. 11, 2001).

* cited by examiner

Primary Examiner—Nay Maung
Assistant Examiner—Alan T. Grantt
(74) Attorney, Agent, or Firm—Amin & Turocy, LLP

(57) ABSTRACT

An access point that is operable under outdoor or industrial environmental conditions may be provided. The access point may include a casing in which an indoor environment access point may be received. The casing may be substantially water-proof and may have rugged characteristics. A conduit that is substantially water proofed may be provided to provide a passageway for conducting electricity to or from the interior of the case. A heat exchanger and circuitry may be provided that regulates the temperature in the case when the indoor access point is operating to maintain the temperature approximately within a range that is suitable for the indoor access point. A back plate, and an antenna may be attached to the case.

41 Claims, 10 Drawing Sheets

METHOD AND APPARATUS FOR WIRELESS OUTDOOR ENVIRONMENT COMMUNICATIONS NETWORKS

BACKGROUND OF THE INVENTION

This invention relates to wireless communications systems, and more particularly, to wireless communications systems that operate under outdoor environmental conditions.

Some known communications systems are designed, manufactured, and implemented for operation that is suitable for indoor environmental conditions (e.g., in buildings, indoors, etc.). Such systems include wireless local area network communications systems ("wireless LANS") that are typically designed, manufactured, and implemented in indoor applications where, for example, wireline installation may not be practical. Such applications include warehouse inventory tracking, portable point of sale, shipping and receiving, packages tracking, etc.

Vendors may have manufactured wireless LANs and components thereof for indoor installation and operation where wireless LANs may typically operate in air conditioned or sheltered offices, warehouses, retail stores, etc. The demand for outdoor environmental operation of such systems has increased over recent times. Outdoor operation may require equipment to be appropriately operational in a wide range of environmental conditions. Such environmental conditions may include extreme weather conditions, such as direct sunlight, tropical conditions, extreme temperatures, rain, snow, etc. Known wireless LANs and components thereof (e.g., access points) are not known to be capable of operating and are not known to be designed to operate in such outdoor weather conditions. Systems and components that meet such demands may be needed without substantially raising the cost, complexity, efficiency, etc. of the system and/or components thereof.

The IEEE 802.11 communications standard as published has been used by some vendors to provide interoperability between wireless LAN equipment. The 802.11 standard specifies communications protocols in which information is transmitted in packets. The standard specifies features such as packet size, packet content information, data rates, roaming, etc. In such known systems, several remote terminals may be in communications with a single access point to receive and transmit information. The standard as published specifies a communications medium that is shared by transmitters (e.g., an access point and one or more remote terminals). The primary type of information that was initially transmitted in systems that were designed to the 802.11 standard as published was information such as barcode information, point of sale information, package tracking information, etc.

SUMMARY OF THE INVENTION

In accordance with the principles of the present invention, an outdoor access point may be provided for use in wireless local area network communications systems. The outdoor access point may include a portable housing.

The portable housing may include a case that may be adapted to receive an indoor access point (e.g., an access point that is suitable for indoor environment operation) and to fixedly hold the indoor access point. The case may be a rugged case that may have characteristics such as being substantially water-proof (when the case is closed), being substantially oil-proof (when the case is closed), having desired shock absorbency, etc. The case may be double-skinned with insulation being provided between the interior and exterior skin of the case.

The portable housing may include a conduit through which electricity may be passed between an interior envelope that is formed when the case is closed and the exterior of the case. The conduit may be substantially water-proofed. The conduit may be considered to be part of the case. Together the conduit and the case provide water-proofing for the portable housing. The conduit may include a gland that is substantially water-proofed and an opening in the case to which the gland has been attached. Cables and cable connectors may be passed through the gland and a tubing may be used in the gland to substantially prevent water from entering the interior envelope of the case through the gland.

The portable housing may include circuitry that includes a sensor that is configured to sense when the temperature in the interior of the portable housing is approximately outside a threshold range (e.g., 0° to 38° Celsius). The threshold range may be determined based on the temperature range in which the indoor access point may be operable (e.g., 0° to 40° Celsius).

The portable housing may include a heat exchanger that is responsive to the sensor. The circuitry may include control circuitry that responsive to the sensor controls the heat exchanger. The heat exchanger may have a thermal conduction connection through the case between the interior of the case and the case exterior. The heat exchanger may be controlled to transfer heat into the interior envelope or transfer heat away from the interior envelope of the case of the portable housing. The heat exchanger may be controlled by the control circuitry in response to the sensor to regulate the temperature in the interior envelope of the case approximately within the predetermined threshold range which may be a temperature range that is suitable for operating the indoor access point.

The heat exchanger may include air circulating devices in the interior envelope of the case that, responsive to the sensor, may circulate air in the case. The heat exchanger may include a fan for cooling a power supply when the outdoor access point includes a power supply in the interior envelope of the case. If desired, power may be supplied using an external battery, solar panel, etc.

In one aspect of the invention, the heat exchanger may include two internal thermal conductors, two external thermal conductors, two Peltier devices, and two thermal connectors. The two internal thermal conductors may be in the interior envelope of the case with an air-circulating device mounted on top of each. The two external thermal conductors may be on the outside of the case and may be attached to an outside surface of the case opposing the two internal thermal conductors. Two openings may have been formed in the shell of the case with each opening being in between one of internal and external thermal conductors. One of the two Peltier devices and one of the thermal conductors may be substantially within each of the openings and may be sandwiched between the thermal conductors at each opening. The Peltier devices may be electrically connected to the control circuitry and may be responsive to the sensor and the control circuitry. At each opening one of the internal thermal conductors, one of the thermal connectors, one of the Peltier devices, and one of the external thermal conductors may be in a heat transfer relationship. The interior envelope of the case may be appropriately heated or cooled based on the direction of a current that may be provided to the Peltier device when the sensor may have sensed that the temperature in the interior envelope is approximately outside the predetermined threshold range.

In another aspect of the invention, the heat exchanger may include an internal thermal conductor, an external thermal conductor, two Peltier devices, and two thermal connectors. The internal thermal conductor may be in the interior envelope of the case with the air-circulating devices mounted thereon. The external thermal conductor may be on the outside of the case and attached to an outside surface of the case opposing the internal thermal conductor. These openings may have been formed in the shell of the case with each opening being in between the interior and exterior thermal conductors. One of the Peltier devices and one of the thermal conductors may be substantially within each of the openings and may be sandwiched between the thermal conductors at each opening. The Peltier devices may be electrically connected to the control circuitry and may be responsive to the sensor and the control circuitry. At each opening, the internal thermal conductor, one of the thermal connectors, one of the Peltier device, and the external thermal conductors may be in a heat transfer relationship. The interior envelope of the case may be appropriately heated or cooled based on the direction of a current that may be provided to the Peltier device when the sensors have sensed that the temperature in the interior envelope is approximately outside the predetermined threshold range.

The portable housing may include a back plate that may fit different adapters for mounting the housing in different environments. The adapters may include a wall-mounting adapter or a pole-mounting adapter for mounting the portable housing on a wall or a pole, respectively. The back plate may be attached to an exterior surface of the case.

The portable housing may include an antenna that is external to the case. The antenna may be attached to the back plate and may have an electrical connection to the interior envelope of the case for the indoor access point.

The portable housing may include a shade for protecting and shading the case. The shade may include connecting bars that connect the shade to the case and that include pivots for raising or lowering the shade. The shade may be made of a plurality of panels. The panels may have a supporting layer (e.g., a layer made of aluminum) and an ultraviolet light protecting layer. The light protecting layer may be positioned to be in the layer that is in the line of path of sunlight when the shade is raised. The protecting layer and the supporting layer may be configured to include an air gap between the two layers.

BRIEF DESCRIPTION OF THE DRAWINGS

Further features of the invention, its nature and various advantages will be more apparent from the following detailed description, taken in conjunction with the accompanying drawings in which like reference characters refer to like parts throughout, and in which.

Skilled artisans will appreciate that some elements in certain FIGS. are illustrated for simplicity and clarity and have not necessarily been drawn to scale.

DETAILED DESCRIPTION OF THE INVENTION

Developing new system devices and components that meet the above-mentioned demands may be cost prohibitive. Wireless LANs and components thereof, which are typically made for indoor operation, may have desired communications capabilities without being sufficiently adverse to outdoor environmental weather conditions. Wireless LANs and/or components thereof that include physical and environmental protection equipment may be provided. The equipment may provide suitable shelter for wireless LAN components (e.g., access points). The equipment may be portable or luggable to allow for quick deployment and retrieval of communications systems. The equipment may provide for convenient access to wireless LAN components that are being sheltered by the equipment. The equipment may provide advantages, such as ease of assembly, modularity through off-the-shelf parts, efficient power consumption, automatic operation, long-term dependability, ease of maintenance, etc.

Figure 1:
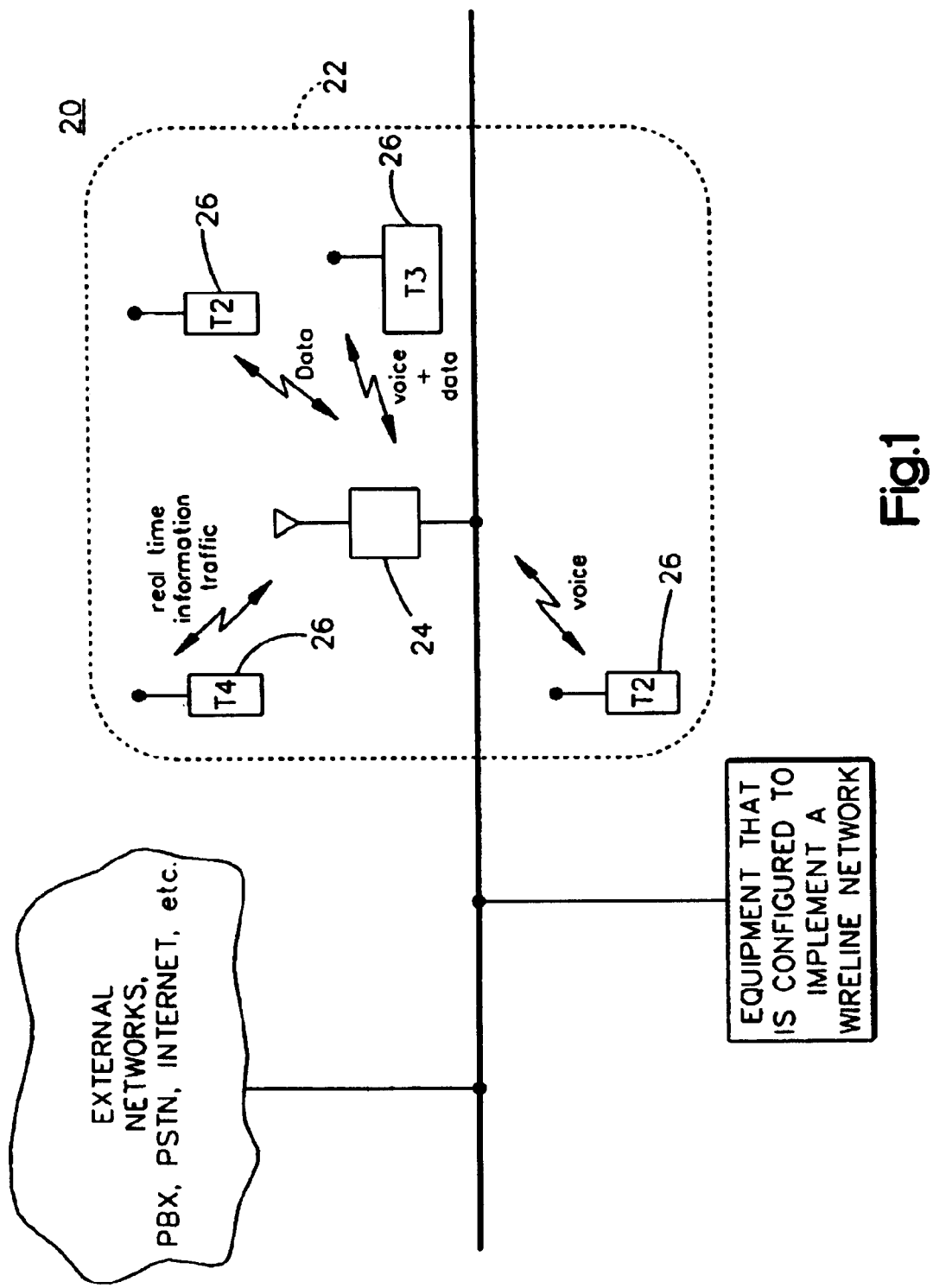
FIG. 1 is a diagram of an illustrative communications network that includes an illustrative wireless local area network communications system in accordance with the present invention.

Indoor and outdoor communications operation of wireless LANs may comprise substantially the same communications activities. With reference now to FIG. 1, wireless LAN 20 may include a plurality of cells 22 (only one is shown for simplicity). Cell 22 may include an access point 24 (which is sometimes referred to as a wireless local bridge) that may have been installed to operate based on the 802.11 standard specifications, as published. Cell 22 may include remote terminals 26 that are associated with access point 24 that may be operating based on the 802.11 standard as published. Each terminal 26 may be a mobile, portable, or stationary terminal. Terminals may be implemented as programmable processor-based units executing software modules. Each terminal 26 may be a desktop workstation, laptop computer, personal computer, palm top computer, handheld personal computer, pen-based computer, personal digital assistant, handheld scanner, data collector, handheld printer, etc. Each terminal 26 may include wireless-network-interface resources that are configured to provide two-way radio or infrared signal communications. Such resources may include an interface card (or an external modem), a software driver, and an antenna. Other suitable resources may also be used, but for clarity and brevity, the wireless network interface resources will be discussed primarily in the context of an interface card, a software driver, and an antenna. The interface card may have been configured to use a standard computer-bus interface (e.g., ISA, PCMCIA, etc.) or standard computer port (e.g., RS232, RS422, etc.) to provide convenient access to terminal equipment.

A network operating system may be implemented on each terminal 26. In each terminal 26, the interface card may be coupled to the network operating system using the software driver. The interface card for each remote terminal 26 may be a network-communications interface. The network interface card for each terminal 26 is typically implemented to use a carrier sense access protocol and to modulate communications signals with a spreading sequence.

Access point 24 may be an interface for communicating between wireless network 20 and a wireline network. Access point 24 may be configured to provide a communications gateway between terminals 26 that are in cell 22 and between a wireline network and the terminals 26. Access point 24 may include a resource(s) (e.g., software, hardware, or a combination thereof) that is configured to connect the access point to a wireline network (e.g., on Ethernet network, a token ring network, radio frequency link etc.). Access point 24 is typically configured to convert signals between wireline and wireless communications mediums. The conversion may allow the access point to pass communication information between the wireline network and wireless remote terminals 26. If desired, access point 24 may be RF linked to a wireline network.

Access points are typically provided with sufficient processing, hardware, software, etc. to operate in compliance with the IEEE 802.11 (e.g., to provide 802.11 roaming, standard 802.11 data rates, etc.) and to provide additional features that are developed by a vendor. Access point 24 may be implemented using a personal computer (e.g., a Power PC, an IBM compatible computer), server, workstation, etc., having an appropriate operating system, wireless-network-interface resources, wireline-network-interface resources, network-operating-system applications, etc.

Access point 24 may be an indoor operation device that may have been designed and manufactured to operate primarily as a stand-alone access point. Such access points include the Spectrum 24 access point manufactured by Symbol Technologies, Inc. Such indoor operation access points may have dimensions that are about 200 mm (length) by 150 mm (width) by 35 mm (height), may weigh approximately 0.8 Kg, and may be operable in temperatures in about the range of 0° to 55° Celsius.

Access point 24 and remote terminals 26 may be configured to communicate using spread spectrum modulation techniques (e.g., direct sequence spread spectrum modulation, frequency hopping spread spectrum modulation, etc.).

The IEEE 802.11 standard includes specifications describing communications frames (e.g. format, content, etc.). Communications frames, which may also be sometimes referred to as packets or messages, may be of variable size with the size of each frame being identified in frame header information (e.g., preamble portion of frame). In some embodiments, the body of each frame may vary from 0 to 2312 octets.

Each terminal 26 may have different communications capabilities and requirements. Access point 24 may manage the communications traffic between terminals 26 and the wireline network. Access point 24 may manage the communications traffic by controlling when frames are transmitted to each remote terminal 26 that is associated with access point 24 in cell 22. The communications traffic in cell 22 may include data frames (e.g., signals that carry frames to provide data communications), voice frames (e.g., signals that carry frames to provide voice communications), real-time frames (e.g., signals that carry frames to provide real-time communications such as multimedia or voice communications), management frames (e.g., signals that carry frames to provide network management communications), etc.

The wireline network that is coupled to access point 24 may include equipment 23 that is configured to implement the wireline network. The wireline network may be coupled to an external network (e.g., PBX, PSTN, Internet, etc.).

Access point 24 may be an indoor operation access point that has been sheltered in a portable housing for outdoor operation. For example, with reference now to FIG. 2a, wireless outdoor operation access point 40 may include indoor-operation access point 42 that may be a component device of a wireless LAN. Outdoor access point 40 may include a portable housing that is to protect indoor access point 42 to operate under outdoor environmental weather conditions.

The portable housing of outdoor access point 40 may comprise case 44, conduit 52, circuitry 74 and a heat exchanger (discussed below). If desired, the portable housing may include shade 62, back plate 54, and antenna 56.

Case 44 may have a double-skinned shell that may have an interior shell 46 and an exterior shell 48. The cavity between the interior and exterior shells 46 and 48 may be filled with insulation, such as foam. The shell may be made of material that has characteristics that are suitable for withstanding environmental conditions that may be encountered in the outdoors or encountered in industrial or military settings. Case 44 may have been an off-the-shelf part that was manufactured for the military to meet military specifications. If desired, case 44 may have been made of military grade ABS plastic. Case 44 may include hinges 50 for closing case 44 to form an envelope inside case 44. Case 44 may be substantially water-proofed (e.g., water impermeable during rain or snow type conditions) when closed. If desired, case 44 may be substantially oil-proof. If desired, case 44 may have shock absorbency characteristics that are suitable for equipment in military or industrial settings. An advantage of the double-skinned shell of case 44 is that when case 44 is closed, condensation in the interior envelope of case 44 may be substantially prevented. Case 44 may have dimensions that are suitable for receiving indoor access point 42 in the interior envelope of case 44 when case 44 is closed.

The portable housing of case 44 may include conduit 52 through which electricity may be passed between the interior envelope of case 44 and the exterior of case 44. Conduit 52 may be a substantially water-proofed passageway for electrical conductors. Conduit 52 may be a substantially water-proofed gland through which cables and connectors are passed to provide electrical connections, such as power or antenna connections. If desired, a plurality of conduits 52 may be provided. If desired, conduit 52 may comprise a channel that is formed in the shell of case 44 (e.g., an off-the-shelf military case) with a gland and water proofing being provided for the channel. Conduit 52 and related parts are also discussed below.

The portable housing of outdoor access point 40 may include back plate 54 that may be attached to one side of case 44. Back plate 54 may be made of rigid materials, such as stainless steel. The portable housing of outdoor access point 40 may include antenna 56 that may be supported with bar 58 that may be connected to back plate 54.

The portable housing of outdoor access point 40 may include a wall-mounting adapter 60. Back plate 54 may have connectors for fitting back plate 54 to wall-mounting adapter 60. Outdoor access point 40 may be mounted to walls using wall-mounting adapter 60. Back plate 54 and wall-mounting adapter 60 are further discussed below.

The portable housing may include shade 62. Connecting frame 64 may be connected to shade 62 to connect shade 64 to receiving members 66 that are attached to case 44 (e.g., receiving members 66 are attached to back plate 54 that is connected to case 44). Pivot joints may be provided for lowering and raising the shade to provide convenient access to case 44. Shade 62 may be raised and may be locked into place when case 44 is closed. Frame 64, wall-mounting adapter 60 and member 54 may be made of durable rigid supporting materials, such as stainless steel or steel that has been treated to prevent rusting.

Figure 2A:
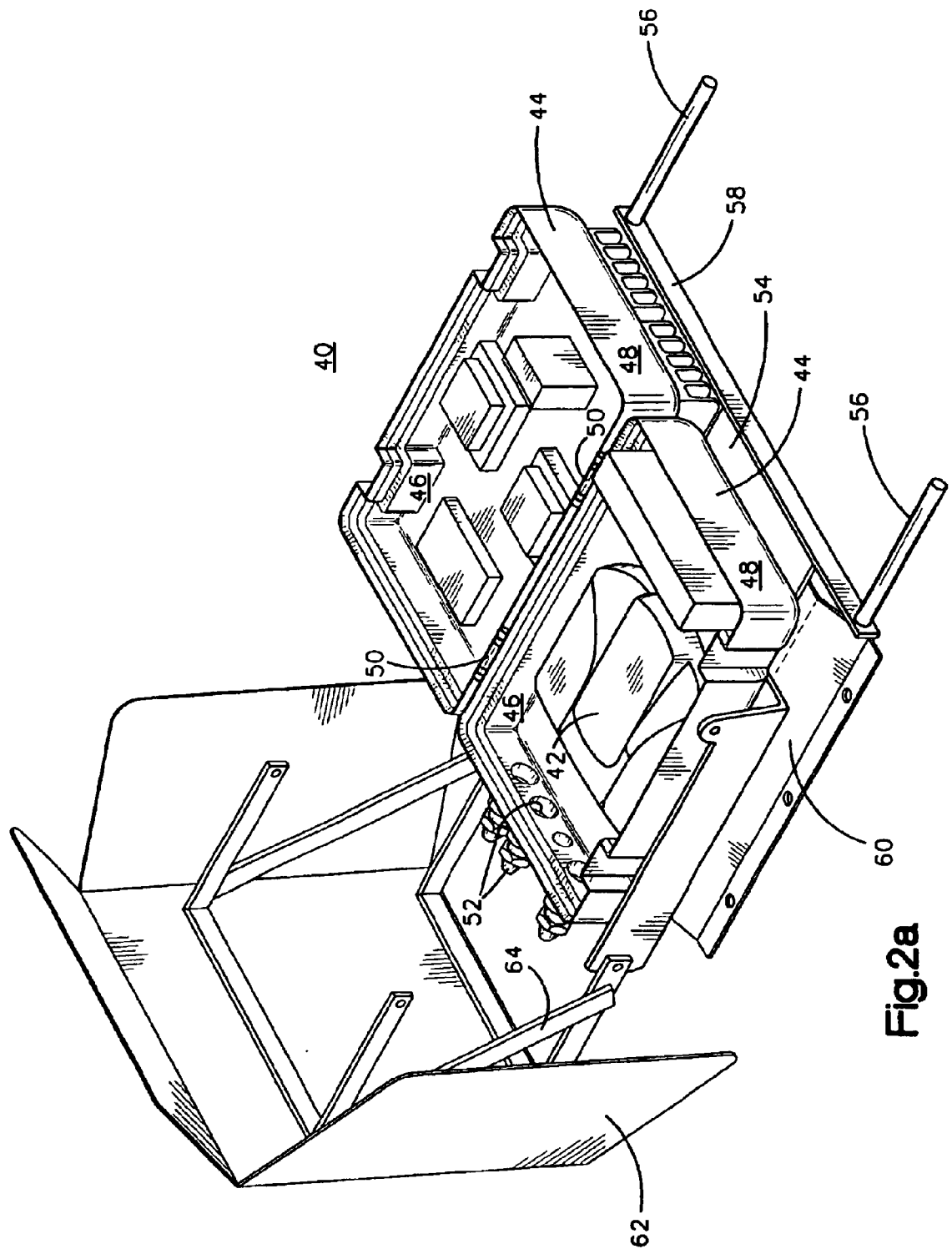
FIGS. 2a and 2b are diagrams of perspective views of an illustrative access point (before being closed) that is for use in a wireless local area network communications system, such as the system of FIG. 1, in accordance with the present invention.
Figure 2B:
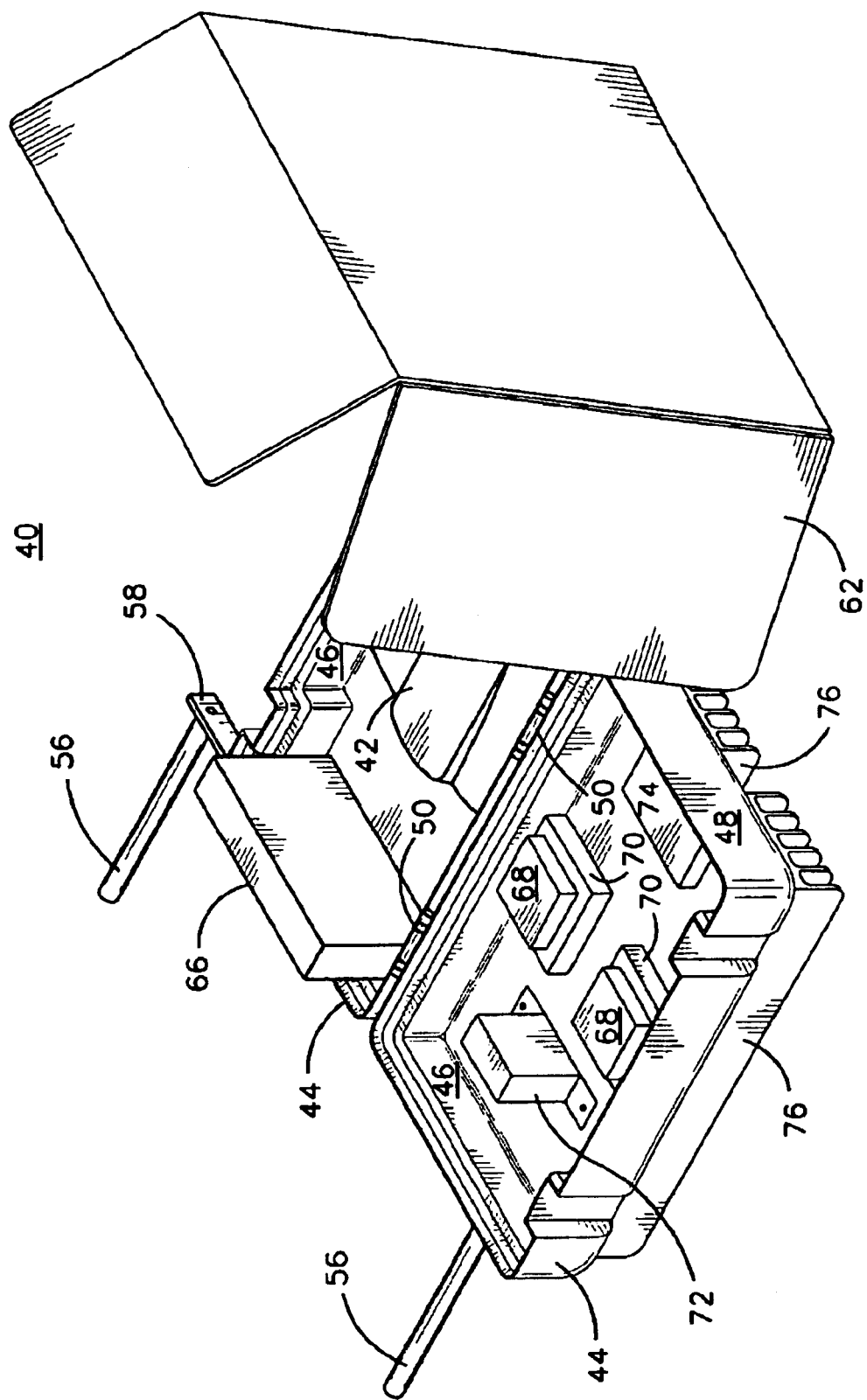

With reference now to FIG. 2b, the portable housing of outdoor access point 40 may include power supply 66. Power supply 66 may be an efficient universal voltage power supply. Power supply 66 may receive AC power through a conduit in case 44 (e.g., conduit 52 of FIG. 2a). If desired, power supply 66 may be a power supply that is an off-the-shelf item that has been designed to be compatible with power provided through power lines in most countries in the world. If desired, outdoor access point 40 may be provided without power supply 66. For example, depending on the requirements of a particular system, an external battery or an external AC adapter may be used.

The portable housing may include a heat exchanger that may include air circulating devices 68. Air circulating devices 68 may be devices that circulate air in the interior envelope of case 44 when case 44 has been closed. Air circulating devices 68 may each be a fan.

The heat exchanger may include internal thermal conductors 70. Internal thermal conductors 70 may be made of materials that have low thermal resistance, such as metal. Internal thermal conductors 70 may each be a metal heat sink. For example, each internal thermal conductor 70 may be an aluminum heat sink with a plurality of extrusion. Such heat sinks may be off-the-shelf items (e.g., items that are typically produced in gross by manufacturers for purchase by customers in general). Each internal thermal conductor 70 may be in a supporting relationship with one of the air-circulating devices 68.

If desired, the portable housing may include fan 72. Fan 72 may be configured to direct air towards power supply 66 when case 44 is closed. Fan 72 may be supported by an interior surface of case 44.

The portable housing may include circuitry 74. Circuitry 74 may include a sensor that senses temperatures. Circuitry 74 may include control circuitry that may be responsive to the sensor that may control some of the heat exchanger components of the portable housing, such as air circulating devices 68 and fan 72. Circuitry 72 may be attached to a surface in the interior of case 44. For simplicity and clarity, the FIGS. are provided without illustrations of electrical connections, such as connections for circuitry 79, power supply 66, access point 42, fan 72, and air-circulating devices 68.

The heat exchanger may include external thermal conductors 76. External thermal conductors 76 may be made of material that has low thermal resistance, such as a metal. External thermal conductors 76 may each be a metal heat sink. For example, external thermal conductor 76 may each be an aluminum heat sink with a plurality of fins. If desired, external thermal conductors 76 may be of such dimensions that a substantial portion of one side of the case may be covered by external thermal conductors 76. External thermal conductors 76 may each be off-the-shelf items.

Figure 3:
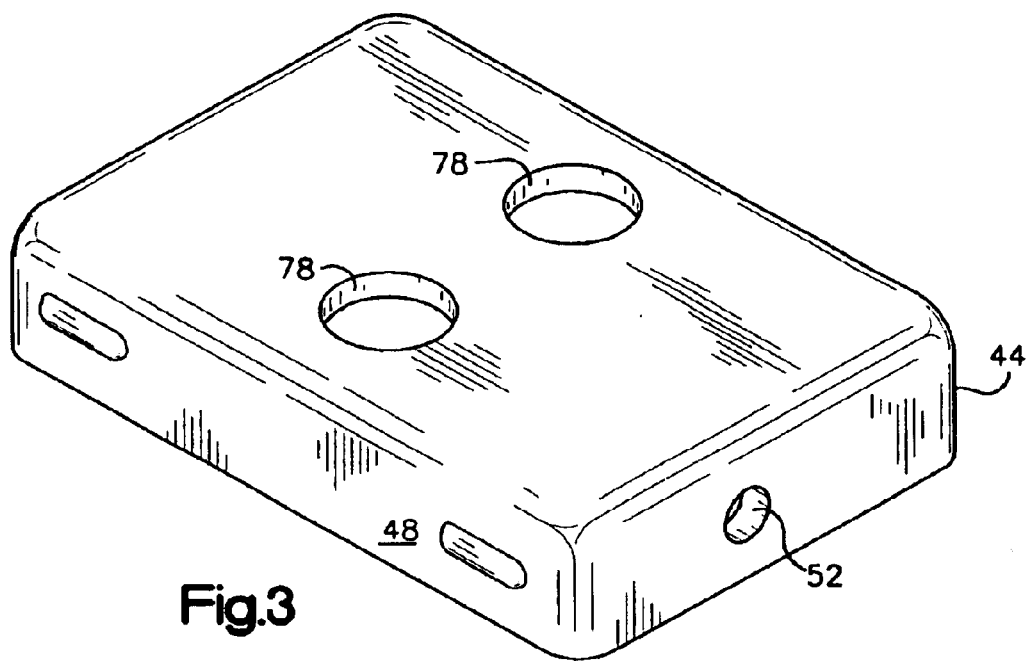
FIG. 3 is a diagram of one side of an illustrative case of an outdoor access point, such as the outdoor access point of FIGS. 2a and 2b, in accordance with the present invention.

A thermal conduction connection may be provided between internal thermal conductors 70 and external thermal conductors 76. The thermal connection may be made through a path in one side of case 44 to which thermal conductors 70 and 76 may have attached. For example, with reference now to FIG. 3, case 44 (for simplicity only a portion of case 44 of FIGS. 2a and 2b is shown) may include channels 78 (e.g., holes in case 44) that may be used to thermally connect internal and external thermal conductors.

If desired, outdoor access point 40 may have dimensions that are about 400 mm (length) by 280 mm (width) by 230 mm (height) and may weight approximately 18 kg.

Figure 4:
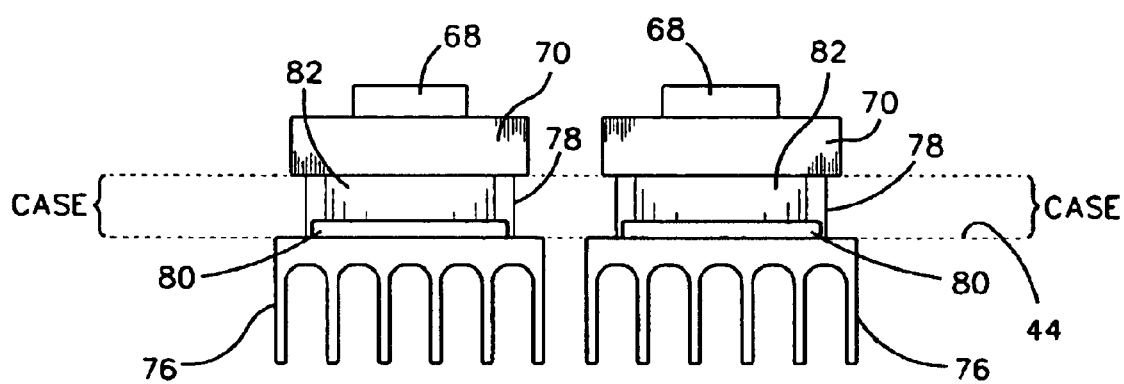
FIG. 4 is a diagram of an illustrative heat exchanger of an outdoor access point, such as the outdoor access point of FIGS. 2a and 2b, in accordance with one aspect of the present invention.

FIG. 4 shows how internal and external thermal conductors 70 and 76 of FIGS. 2a and 2b are thermally connected. With reference now to FIG. 4, the heat exchanger of the portable housing of FIGS. 2a and 2b that includes air circulating devices 68, internal thermal conductors 70, and external thermal conductors 76 may include Peltier devices 80 and thermal connectors 82. Each one of Peltier devices 80 and a corresponding one of thermal connectors 82 may be sandwiched between a pair of internal and external thermal conductors 70 and 76 and may be positioned to be substantially within one of channels 78 in case 44. External thermal conductors 76 may be positioned to be substantially flush with a surface of case 44 to substantially prevent air or liquids to enter channels 78. Thermal connectors 82 may be heat sinks or may be solid metal members in a shape that is suitable to fit in each channel 78 and which is to provide a low thermal resistance conductor that connects internal thermal conductors 70 to Peltier devices 80. Peltier devices 80 may be devices that are known to one of ordinary skill in the art. A Peltier device may typically be a semiconductor device that has two sides that may be configured to heat one side while cooling the other side. The side that is heated (or cooled) is determined based on the direction in which current is being applied to the device. A semiconductor compound may have been applied to the conducting surfaces of each one of the Peltier devices 80 to provide better contact between Peltier devices 80 and adjacent devices.

In operation, case 44 may be closed to substantially water-proof the interior envelope of the closed case and power may be provided to the interior envelope via conduit 52. Power may be AC power which may be converted to DC power by power supply 66 and provided to access point 42. Power may be DC power which may be provided directly to access point 42. Access point 42 may operate based on 802.11 specifications as published. Access point 42 may receive and transmit communications frames via antenna 56 and may have electrical connections to antenna 56 through conduit 52. If desired, a plurality of conduits may be provided with each being provided for a different purpose (e.g., power, communications, etc.). Indoor access point 42 may typically generate approximately 10–12 watts of heat when indoor access point 42 is operating. Indoor access point 42 may typically have operating temperatures of approximately 0° to 40° Celsius.

Sensor of circuitry 74 may be operating to sense when the temperature in the interior envelope of the case has reached a level that is approximately outside a predetermined temperature range. For example, for an access point that has operating temperatures that are approximately at least within the range of 0° to 40° Celsius, the predetermined range for the sensor may be approximately 0° to 38° Celsius. Control circuitry of circuitry 74 may control the heat exchanger (e.g., components of the heat exchanger, such as Peltier devices 80) in response to the sensor sensing that the temperature in the interior envelope is outside the predetermined range (e.g., 0° to 38° Celsius). Depending on whether the sensed temperature is below or above the predetermined range, the heat exchanger may heat or cool the interior envelope of the case.

Fans 68 may be activated in response to sensing that the temperature is outside the predetermined temperature range to circulate air in the interior envelope. The interior air may be circulated to maintain the temperature substantially the same throughout the interior envelope. Heat may be transferred through case 44 by thermal conduction between internal and external thermal conductors 70 and 76. The rate of heat transfer may be determined based on the thermal conductivity of Peltier devices 80 that is sandwiched between internal and external thermal conductors 70 and 76. Heat may be transferred into the respective environments of the thermal conductors 70 and 76 through air convection. For each one of Peltier devices 80, the direction of heat transfer may be controlled by the direction of the current that is passed through that Peltier device 80. The thermal conductivity of each one of Peltier devices 80 may depend on the amplitude of the current that is applied to that device. The current may be controlled by the control circuitry of circuitry 79 that is responsive to the sensor of circuitry 74. The control circuitry may control the direction of electrical current flow through the Peltier devices 80, which determines whether the interior envelope of case 44 is heated or cooled. Circuitry 74 may comprise solid state technology that may have a long operating life.

Power supply 66 may generate up to 30 watts of heat. Fan 72 may be activated to direct air towards power supply 66 when the sensor has sensed the temperature inside the case to be outside the predetermined range. The interior of case 44 may be without fan 72 remove extra space when outdoor access point 40 is without internal power supply 66, (e.g., when using an external battery power source).

Indoor access point 42 may be of the type that is substantially without internal heating or cooling mechanisms.

It has been found that outdoor access point 40 maintains the temperature in the interior envelope of case 44 at temperatures that are approximately within a range that is suitable for operating indoor access point 42 (e.g., approximately between 0° and 40° Celsius). It has been found that the interior temperature is maintained in the suitable operating range for indoor access point 42 when outdoor access point 42 is under outdoor environment conditions. For example, it has been found that outdoor access point 40 is operable at least at temperatures approximately in the range of −40° to +65° Celsius with outdoor access point 40 maintaining the interior temperature approximately in the range of 0° to 40° Celsius. Outdoor access point 40 may be operable at higher temperatures when using shade 62 (further discussed below).

Figure 5:
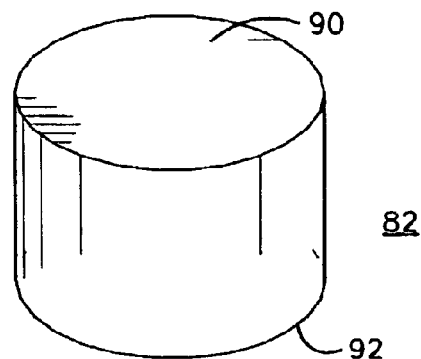
FIG. 5 is a diagram of an illustrative thermal connector for use in a heat exchanger, such as the heat exchanger of FIG. 4, in accordance with the present invention.

As shown in FIG. 5, thermal connector 82 may be cylindrical in shape and may have top surface 90 and bottom surface 92. Top and bottom surfaces 90 and 92 may be positioned in the portable housing to be in a heat-transfer relationship with internal thermal conductor 70 and Peltier device 80. Thermal connector 82 may be a heat sink and may comprise low thermal resistance materials, such as copper, aluminum, etc.

Figure 6:
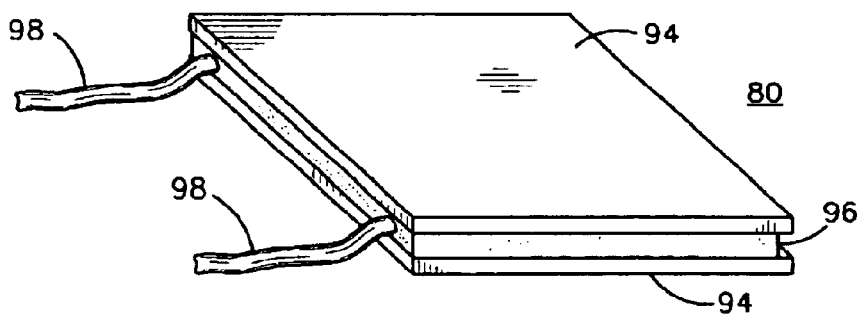
FIG. 6 is a diagram of an illustrative Peltier device for use in a heat exchanger, such as the heat exchanger of FIG. 4, in accordance with the present invention.

As shown in FIG. 6, Peltier device 80 may have opposing flat surfaces 94 and semiconductor layer 96. An electrical current may be passed through Peltier device 80 using conductors 98. When a current is flowing in conductors 98, Peltier device 80 may heat one of flat surfaces 94 while cooling the other one of flat surfaces 94. The direction of the current may determine which surface 94 is cooled and which is heated. The amplitude of the current may determine the heat differential between surfaces 94. Peltier device 80 may be positioned in the portable housing to be in between internal and external thermal conductors 70 and 76 and to be in a heat-transfer relationship with internal and external thermal conductors 70 and 76. Peltier device 80 may be in a heat-transfer relationship with internal thermal conductor 70 or external thermal conductor 76 through a thermal connector, such as thermal connector 82. A semiconductor compound may have been applied on surfaces 94 to form a low thermal resistance contact with adjacent devices. Peltier device 80 and thermal connector 82 may be configured to have Peltier device 80 in substantially direct contact with external thermal conductor 76 and to have Peltier device 80 in thermal contact with internal thermal conductor 70 through thermal connector 78. If desired, Peltier device 80 and thermal connector 82 may be configured to have Peltier device 80 in substantially direct contact with internal thermal conductor 70 and to have Peltier device 80 in thermal contact with external thermal conductor 76 through thermal connector 82. Other configurations, such as using two thermal connectors, may also be used.

Figure 7:
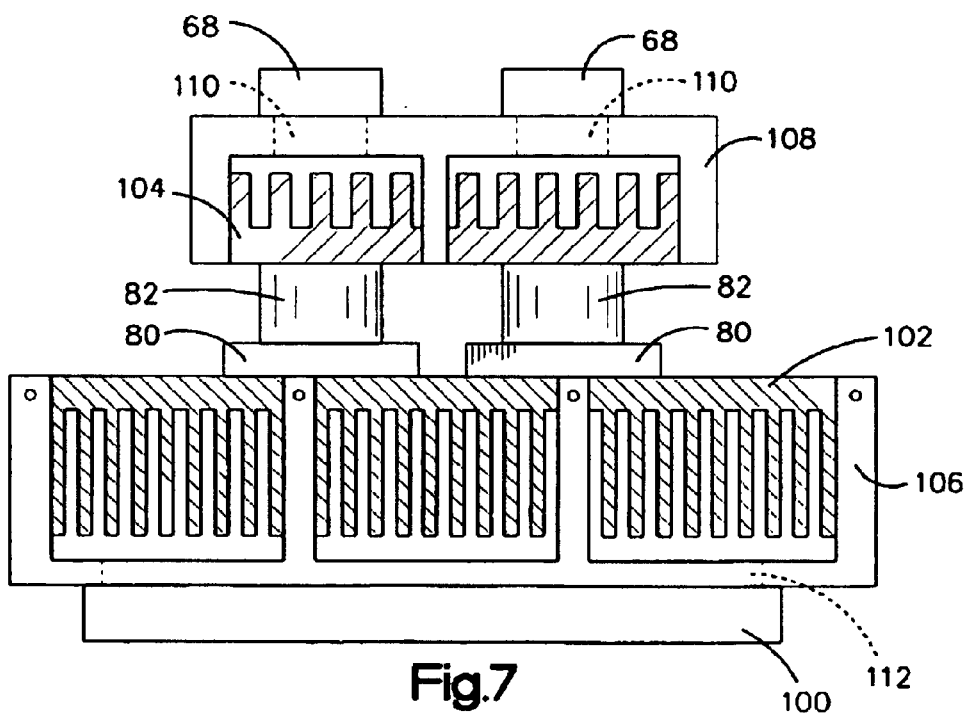
FIG. 7 is a diagram of an illustrative heat exchanger for an outdoor access point, such as the outdoor access point of FIGS. 2 and 2b, in accordance with another aspect of the present invention.

Another embodiment of the heat exchanger portion of the portable housing that is in accord with the principles of the present invention is illustratively shown in FIG. 7. The heat exchanger of outdoor access point 40 may include external fans, such as external fan 100. External fan 100 may be mounted over external thermal conductor 102 using external mounting frame 106. An opening may be provided in external mounting frame 106, such as passageway 112 to allow air to pass between external fan 100 and external thermal conductor 102. External thermal conductor 102 may be a solid (e.g., substantially in one piece) heat sink that has dimensions that substantially cover an outside surface of case 44. External thermal conductor 102 may have extruded metal elements for transferring eat through air convection. Peltier devices 80 and thermal connectors 82 may provide a heat transfer relationship between external thermal conductor 102 and internal thermal conductor 104. Internal thermal conductor 104 may be a solid heat sink with extruded metal elements for transferring heat through air convection. Internal mounting frame 108 may be used to mount air-circulating devices 68 on internal thermal conductor 104. Internal mounting frame 108 may include an opening, such as passageway 110, that allows air to pass between internal thermal conductor 104 and air-circulating devices 68. In operation, air-circulating devices 68, external fan 100, and Peltier devices 80 may be activated to cool or heat the interior of housing when the temperature in the interior of the housing is sensed to be outside a predetermined threshold range (e.g., 0° to 38° Celsius). Depending in the size of external thermal conductor 102 there may be more than one of external fan 100 mounted on external mounting frame 106.

Figure 8:
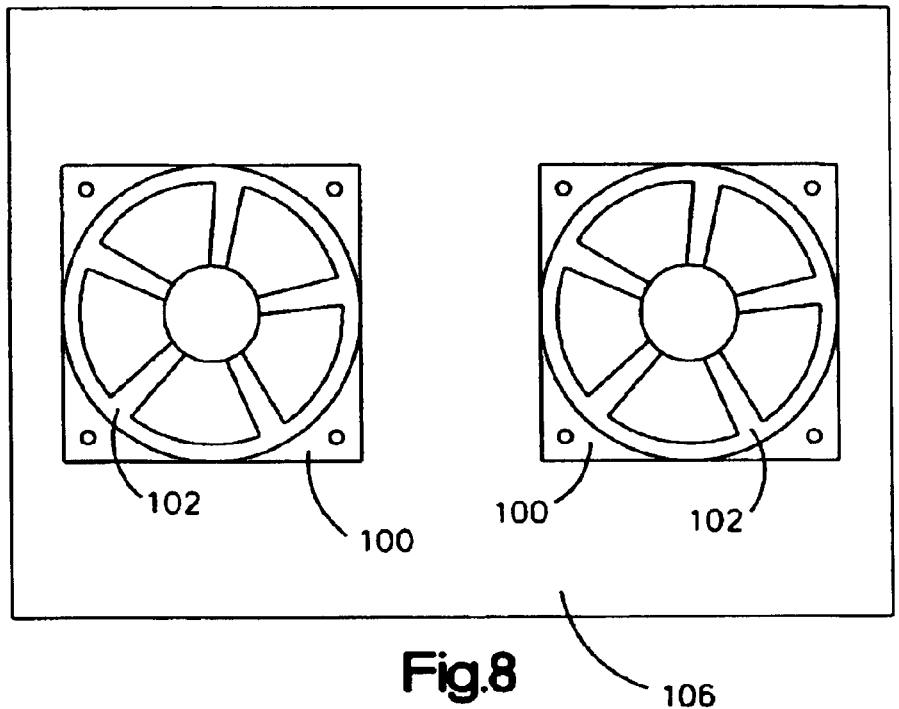
FIG. 8 is a diagram of the illustrative heat exchanger of FIG. 7 from a top perspective view of the external fans of the heat exchanger in accordance with the present invention.

For example, as shown in FIG. 8, two external fans 100 may be mounted on external mounting frame 106. Two circular openings in external mounting frame 106 may allow for air to flow to or away from external thermal conductor 102.

It has been found that outdoor access point 40 using the heat exchanger of FIGS. 7 and 8 is appropriately operable at least at temperatures approximately in the range of −50° to +65° Celsius. It has been found that in such a configuration, the interior temperature of outdoor access point 40 is maintained in a suitable range for operating indoor access point 42 (e.g., approximately 0° to 40° Celsius) when outdoor access point 40 is at least under temperatures approximately in the range of −50° to +65° Celsius.

Figure 9:
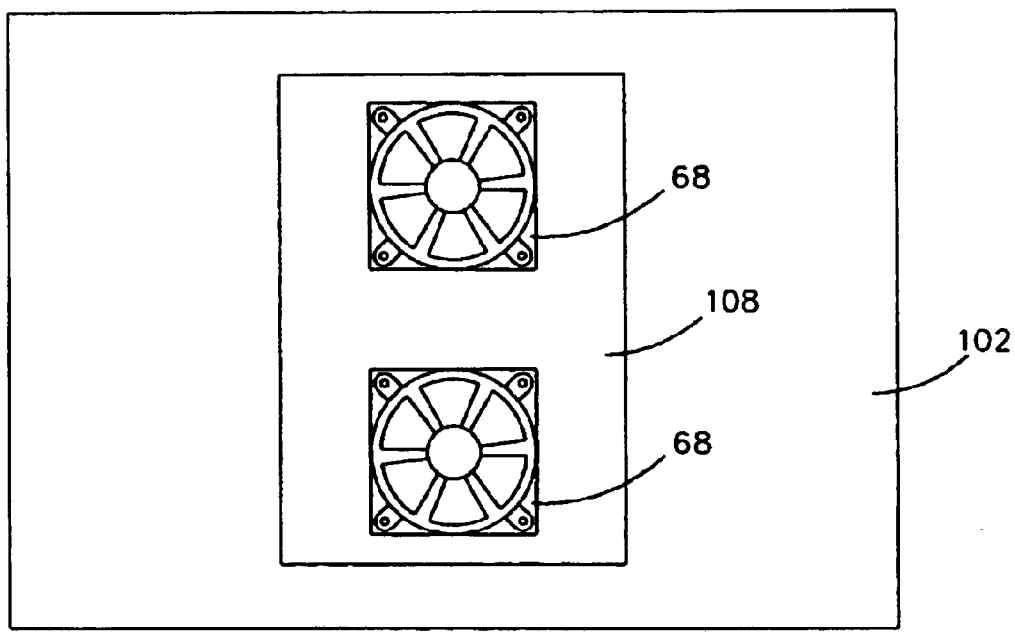
FIG. 9 is a diagram of the illustrative heat exchanger of FIG. 7 from a top perspective view of the air-circulating devices of the heat exchanger in accordance with the present invention.

Air-circulating devices 68 may be fans. For example in FIG. 9, the heat exchanger of FIG. 7, shown from the perspective view of the side of the heat exchanger having air-circulating devices 68, includes air-circulating devices 68 that are fans. Air-circulating devices 68 may be positioned in the portable housing to be substantially opposite indoor access point 42 when case 44 is closed. If desired, air-circulating devices 68 may also be used in transferring heat into or away from the interior envelope of the portable housing.

Figure 10A:
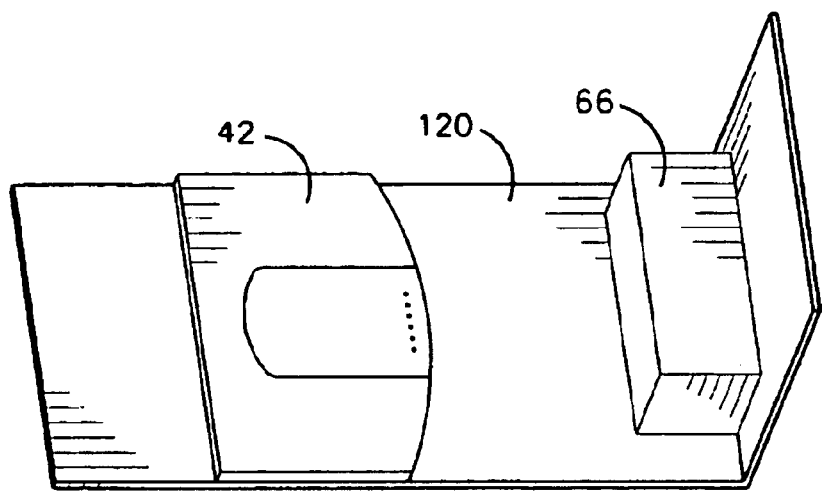
FIGS. 10a and 10b are diagrams of an illustrative mounting plate for mounting an indoor access point that may be part of an outdoor access point, such as the outdoor access point of FIGS. 2a and 2b, in accordance with the present invention.
Figure 10B:
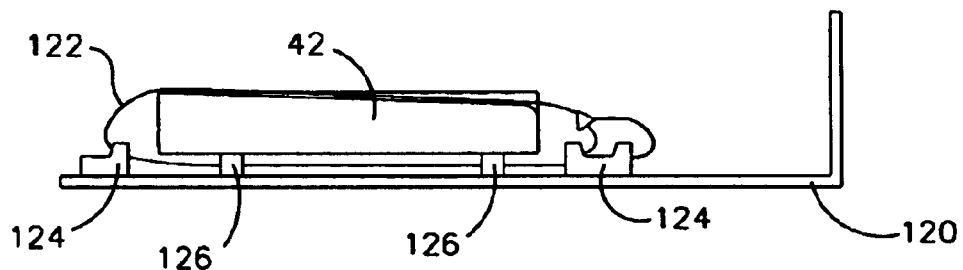

The portable housing of outdoor access point 40 may include a mounting plate for fixedly holding internal access point 42 in outdoor access point 40 (e.g., in the interior envelope of case 44). For example, as shown in FIGS. 10*a* and 10*b*, indoor access point 42 may be fixedly held to mounting plate 120. Mounting plate 120 may be an L-shaped member that may be mounted to an interior surface of case 44. Indoor access point 42 may be held in place by using cable ties 122, such as re-usable plastic cable ties, that are fixed in position using anchors 124 that have been attached to mounting plate 120. Cable ties 122 may be passed underneath indoor access point 42 in the space that may be provided by access point legs 126. Mounting member 120 may be adapted to receive power supply 66 and to hold the power supply 66. In FIG. 10*b*, mounting plate 120 may be without power supply 66 because the supply of power to access point 42 may be from an external battery or from external solar panels. An advantage of cable ties 122 and mounting plate 120 may be that indoor access point 42 may be easily accessible for maintenance or other purposes.

Figure 11:
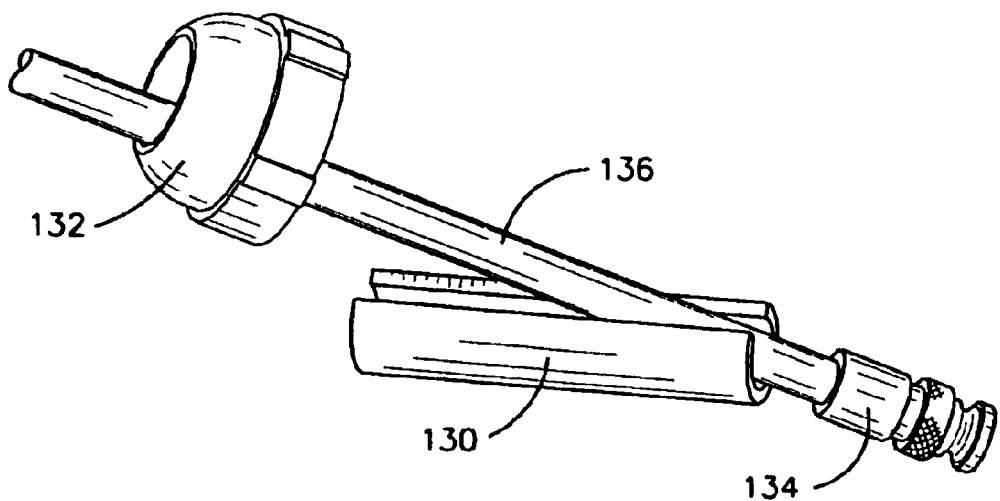
FIG. 11 is a diagram of an illustrative gland cover, illustrative cable, illustrative cable connector, and illustrative tubing for an outdoor access point, such as the outdoor access point of FIGS. 2a and 2b, in accordance with the present invention.

Conduit 52 may comprise a substantially water proofed gland that may contain tubing 130 and gland cover 132 of FIG. 11. Gland cover 132 may have an opening that is of a size that allows cable connector 134 (e.g., a BNC connector) and cable 136 to be passed through. Tubing 130 may be made of rubber or of materials with physical characteristics that are similar to the physical characteristics of rubber (e.g., substantially water impermeable). Tubing 132 may substantially water-proof the gland when a portion of tubing 132 has been partly pulled through the opening of the gland cover 132 to form a substantially water-proof seal between cable 136 and the opening of gland cover 132.

Figure 12:
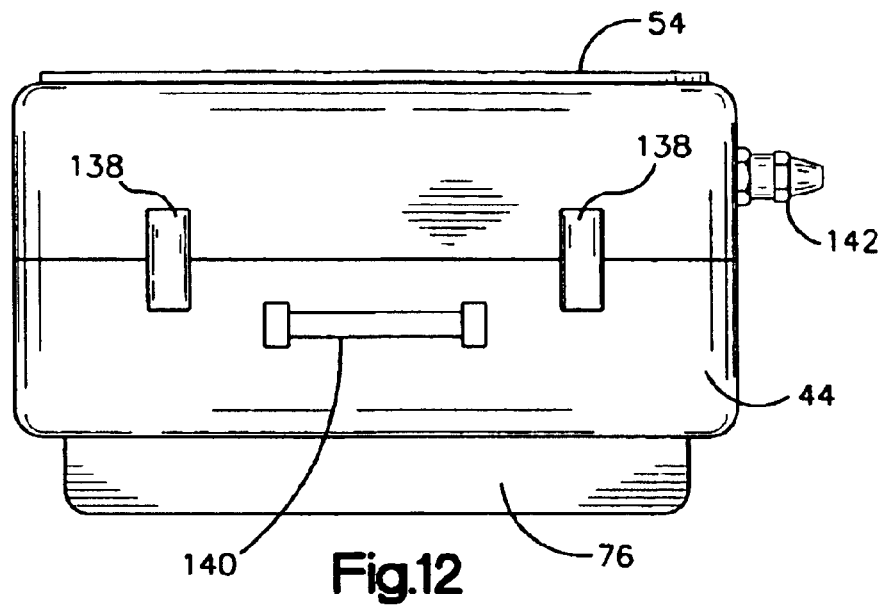
FIG. 12 is a diagram of an illustrative portable housing for use in an outdoor access point, such as the outdoor access point of FIGS. 2a and 2b, in accordance with the present invention.

The portable housing may include locks for case 44 and a carrying handle. For example, as shown in FIG. 12, case 44 may include locks 138 that may be used to lock case 44 when case 44 is closed. When closed and locked, a substantially water-proofed seal may be formed where the two sides of case 44 meet. Handle 140 may be attached to case 44 that allows the case to be lugged to different locations.

Conduit 52 may include gland base 142 that may mate with gland cover 132 of FIG. 11 to form a gland for the portable housing. Cable connector 134, cable 136, and a portion of tubing 130 may be passed through gland base 142. Gland cover 132 may be snapped or screwed on to gland base 142.

Figure 13:
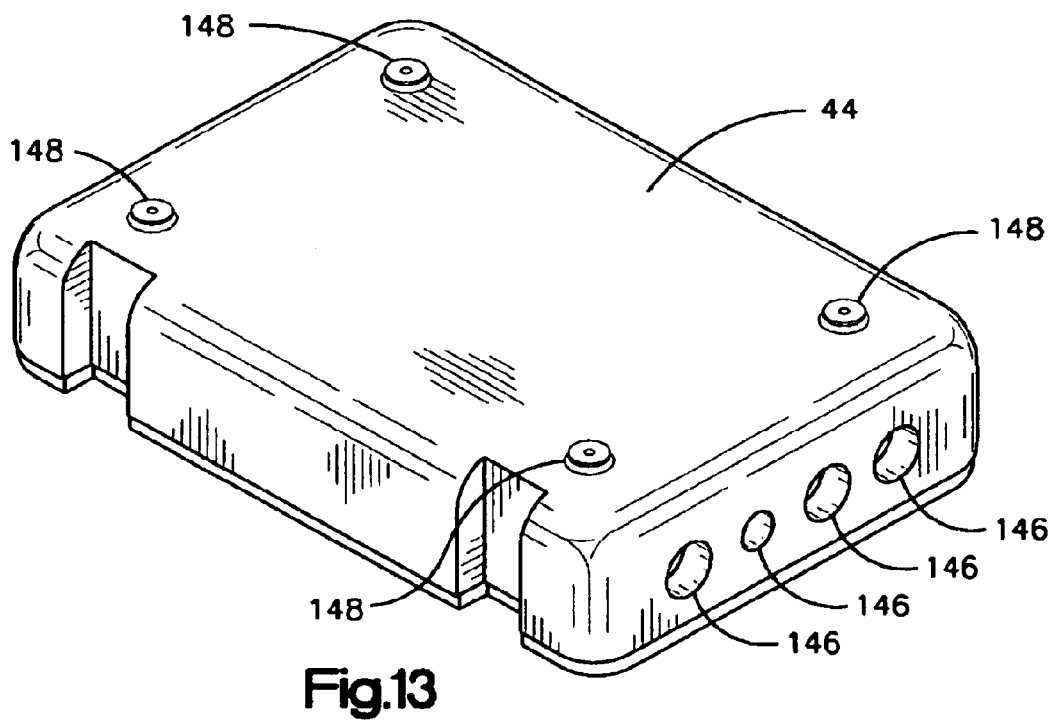
FIG. 13 is a diagram of one side of an illustrative case for an outdoor access point, such as the outdoor access point of FIGS. 2a and 2b, in accordance with the present invention.

Case 44 may include a plurality of conduits. For example as shown in FIG. 13, a plurality of holes 146 may have been formed in case 44 (for simplicity, one of the two sides of case 44 is shown). Each hole 146 may be used to provide an individual conduit, such as conduit 52 of FIG. 2*a*. Case 44 may include a plurality of receiving members 148 that may each have been adapted to receive a screw or a bolt. Receiving members 148 may be for attaching a back plate, such as back plate 54 of FIG. 2*a*, to case 44.

Figure 14:
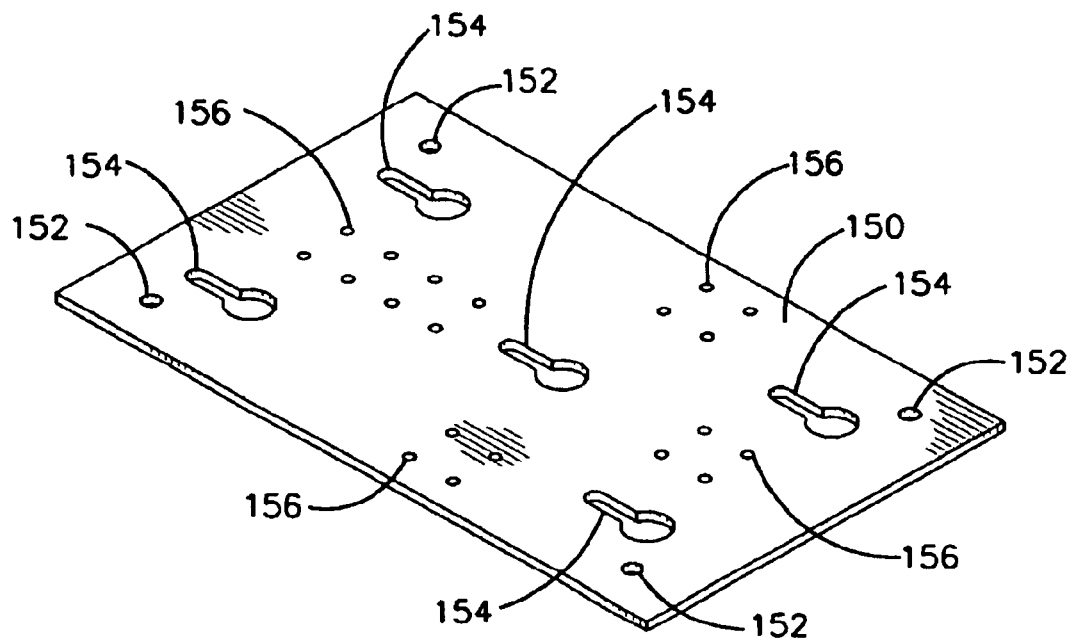
FIG. 14 is a diagram of an illustrative back plate for an outdoor access point, such as the outdoor access point of FIGS. 2a and 2b, in accordance with the present invention.

Case 44 may be attached to a back plate, such as back plate 150 of FIG. 14. Back plate 150 may include a plurality of openings 152 that are to be used to attach back plate 152 to case 44. Openings 152 may have been adapted to receive a bolt or screw to attach back plate 150 to receiving members 148 of case 44 (FIG. 13). Back plate 150 may include a plurality of key holes 154 that may fit mating keys of different adapters that may be used to mount outdoor access point 40 in different environments (e.g., on a pole, on a wall, etc.). Back plate 156 may include a plurality of mounting points 156 that may be attached to adapters (e.g., using screws) to mount outdoor access point 40 in different environments.

Figure 15:
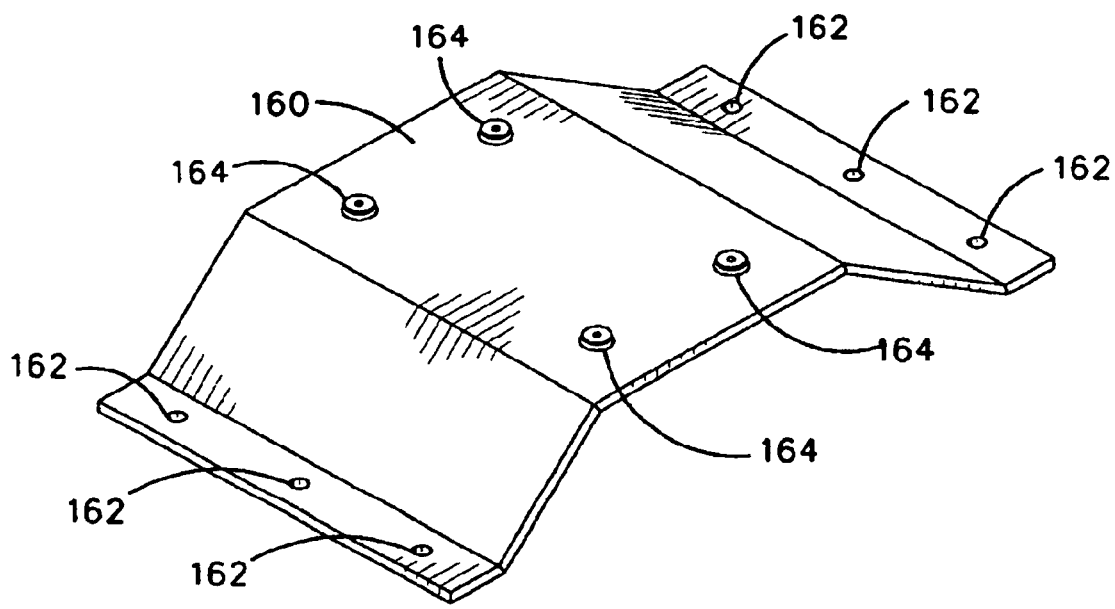
FIG. 15 is a diagram of an illustrative wall-mounting adapter for an outdoor access point, such as the illustrative access point of FIGS. 2a and 2b, in accordance with the present invention.

Back plate 150 may be fitted with a wall-mounting adapter. For example, as shown in FIG. 15, back plate 150 may be fitted with wall-mounting adapter 160 of FIG. 15. Wall-mounting adapter 160 may include a plurality of attachment points 162 and keys 164. Keys 164 may fit keyholes 154 of back plate 150 and attachment points 162 may be used to mount the housing of outdoor access point 40 to a wall using screws, bolts, etc., via attachment points 162.

Figure 16:
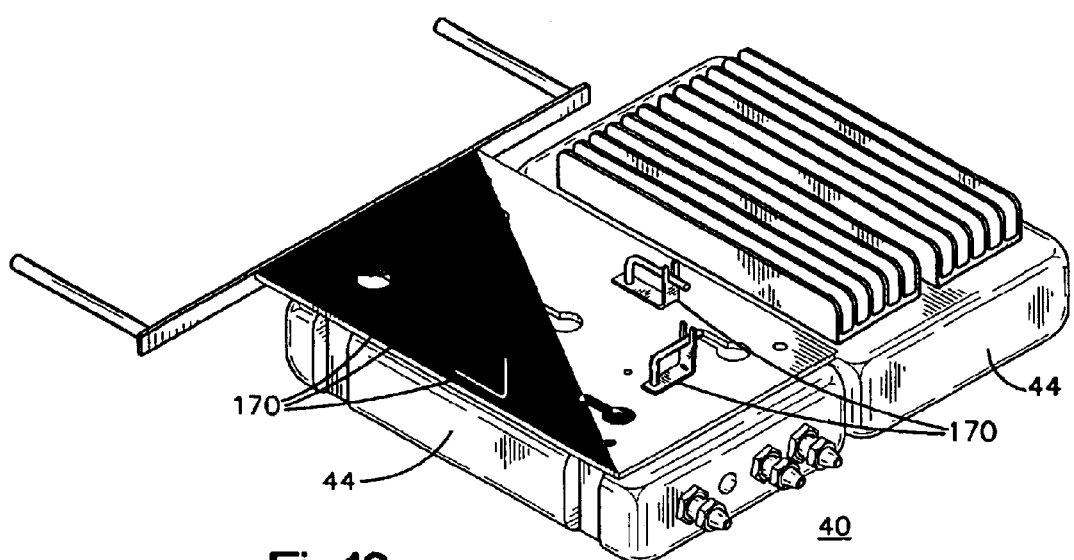
FIG. 16 is a diagram of an illustrative outdoor access point having pole-mounting adapters in accordance with the present invention.

Back plate 150 may be fitted with a plurality of pole-mounting adapters. For example, as shown in FIG. 16, pole-mounting adapters 170 may be attached to back plate

150 using mounting points 156 (FIG. 14) to mount access point 40 (e.g., the housing of access point 40) to a horizontal or vertical pole.

Figure 17:
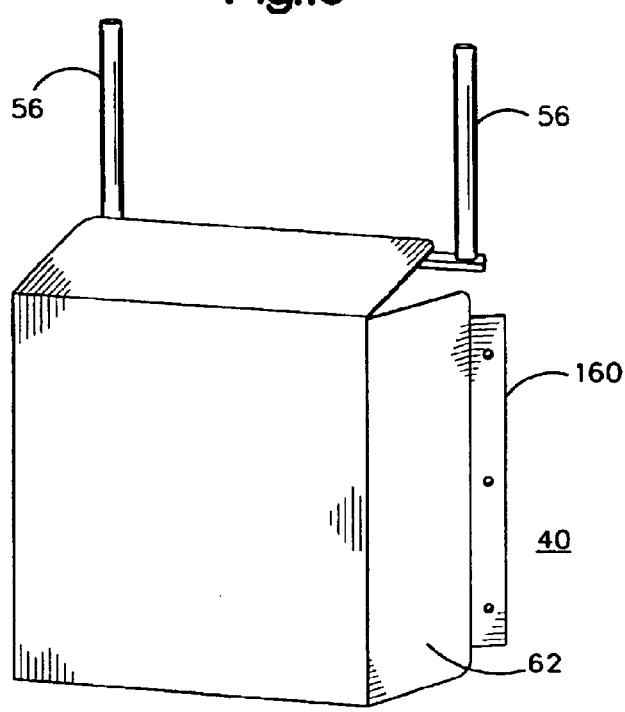
FIG. 17 is a diagram of an illustrative outdoor access point with a raised shade in accordance with the present invention.
Figure 18:
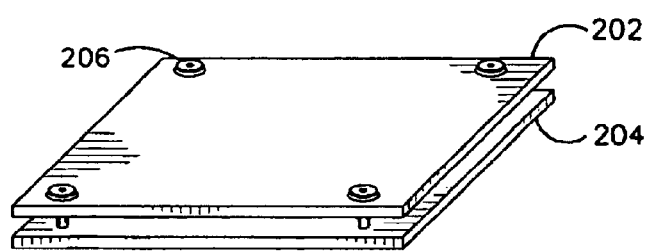
FIG. 18 is a diagram of an illustrative panel of the shade of FIG. 17 in accordance with the present invention.

FIG. 17 shows outdoor access point 40 with wall mounting adapter 160 and with shade 62 that has been raised to protect access point operation during direct sunlight. Shade 62 may comprise a plurality of layers. For example, as shown in FIG. 18, panel 200 may be one of a plurality of panels that form shade 62. Panel 200 may include supporting layer 204 that may be part of a supporting frame for shade 62 and that may be made of rigid and lightweight materials, such as aluminum. Panel 200 may include ultraviolet light protecting layer 202 that may be attached to supporting layer 204 using physical connectors 206 that leave an air gap between layer 202 and 204. Light protecting layer 202 may be made of ultraviolet-proof sheets of plastic. It has been found that shade 160 with panels, such as panel 200, substantially reduces the temperature behind shade 160 during direct sunlight. For example, it has been found that on a day during which the temperature was approximately 25° Celsius when an outdoor access point 40 that included shade 160 was exposed to substantially direct sunlight for approximately 20 minutes, the temperature at shade 160 reached approximately 58° Celsius while the temperature behind shade 160 was approximately 26° Celsius.

Thus, the demands for outdoor environmental operation of wireless LANs may be met. Such demands are met without substantially increasing cost, complexity, maintenance requirements, etc. Moreover, a greater range of communications services may be provided by wireless LANs. Outdoor wireless LANs may be deployed in airports, military fields, emergency services during incidents or disasters, networks to increase network backbone during large sporting events, construction sites where the network infrastructure may change constantly as a project progresses, etc. Information such as voice, data, audio, graphics, etc., may be transmitted in such outdoor WLANs. Outdoor wireless LANs may also be deployed for more permanent purposes, such as marshaling yards, sea front dock sites, ferry ports, motor ways, car-rental return sites, shipping yards, etc.

The foregoing is merely illustrative of the principles of this invention and various modifications can be made by those skilled in the art without departing from the scope and spirit of the invention.

What is claimed is:

1. A portable housing that protects a wireless communications network access point, operable under indoor weather conditions, from weather conditions when operating outdoors, comprising:
    a case that has an interior substantially water-proofed envelope that is formed when the case is closed and that is adapted to fixedly hold the access point in the interior envelope;
    a conduit that is substantially water-proofed and that through which electricity is to be passed between the interior envelope of the case and case exterior;
    a sensor that senses temperature in the interior envelope of the case; and
    a heat exchanger that responds to the sensor to regulate temperature in the interior envelope of the case with a thermal conduction connection through the case that extends in a path that reaches from the interior envelope of the case to case exterior to maintain interior temperature to be approximately within a range of temperatures that is suitable for operating the access point.

2. The housing of claim 1 wherein the heat exchanger comprises a Peltier device that is responsive to the sensor to regulate the interior temperature.

3. The housing of claim 2 wherein the heat exchanger includes two heat sinks that are on opposing sides of the Peltier device.

4. The housing of claim 1 wherein the heat exchanger is to maintain the interior temperature to be between about 0° Celsius and about 38° Celsius when the access point is operating.

5. The housing of claim 1 wherein the heat exchanger is to maintain the interior temperature to be between about 0° Celsius and about 38° Celsius during access point operation at least when the housing is under weather conditions that have temperatures between about −40° Celsius and +65° Celsius.

6. The housing of claim 1 wherein the heat exchanger is to maintain the interior temperature to be between about 0° Celsius and about 38° Celsius, during access point operation at least when the housing is under weather conditions that have temperatures between about −50° Celsius and +65° Celsius.

7. The housing of claim 1 further comprising a fan in the interior envelope of the case to circulate the air therein.

8. The housing of claim 1 wherein the case comprises a double-skinned shell that substantially prevents condensation from forming in the interior of the case.

9. The housing of claim 1 wherein the conduit comprises a gland through which a connector and cable connected to the connector are passed and which is substantially water-proofed when the cable is in the gland.

10. The housing of claim 1 wherein the case is adapted to further hold a power supply.

11. The housing of claim 1 wherein the conduit comprises a connector for connecting the housing to an external power supply to provide power to the access point.

12. The housing of claim 1 further comprising a heat shield that is to shade the case during access point operation.

13. The housing of claim 1 further comprising a back plate that is to be fitted to different adapters when mounting the housing in different environments.

14. The housing of claim 1 further comprising an antenna for the access point.

15. A system for use in a wireless communications network, comprising:
    an access point that is operable in the wireless communications network under indoor weather conditions;
    a housing that is used to carry the access point device and to protect the access point when the access point is to operate under outdoor weather conditions, the housing comprising:
    a case that has an interior substantially water-proofed envelope that is formed when the case is closed and that is adapted to fixedly hold the access point in the interior envelope of the case;
    a conduit that is substantially water-proofed and that through which electricity is to be passed between the interior envelope of the case and case exterior;
    a sensor that senses temperature in the interior of the case; and
    a heat exchanger that responds to the sensor to regulate temperature in the interior envelope of the case with a thermal conduction connection through the case that extends in a path from the interior envelope of the case to case exterior to maintain interior temperature to be approximately within a range of temperatures that is suitable for operating the access point.

16. The system of claim 15 wherein the heat exchanger comprises a Peltier device that is responsive to the sensor to regulate interior temperature.

17. The system of claim 16 wherein the heat exchanger includes two heat sinks that are on opposing sides of the Peltier device.

18. The system of claim 15 wherein the heat exchanger is to maintain interior temperature to be between about 0° Celsius and about 38° Celsius when access point is operating.

19. The system of claim 15 wherein the heat exchanger is to maintain the interior temperature to be approximately between about 0° Celsius and about 38° Celsius during access point operation at least when the housing is under weather conditions that have temperatures at least between about −40° Celsius and +65° Celsius.

20. The housing of claim 1 wherein the heat exchanger is to maintain the interior temperature to be between about 0° Celsius and about 38° Celsius, during access point operation at least when the housing is under weather conditions that have temperatures between about −50° Celsius and 65° Celsius.

21. The system of claim 15 further comprising a fan in the interior envelope of the case to circulate the air therein.

22. The system of claim 15 wherein the case comprises a double-skinned shell that substantially prevents condensation from forming in the interior envelope of the case.

23. The system of claim 15 wherein the conduit comprises a gland through which a connector and cable connected to the connector are passed and which is substantially water-proofed when the cable is in the gland.

24. The system of claim 15 wherein the case is adapted to further hold a power supply.

25. The housing of claim 15 wherein the conduit comprises a connector for connecting the housing to an external power supply to provide power to the access point.

26. The system of claim 15 further comprising a heat shield that is to shade the case during access point operation.

27. The system of claim 15 further comprising a back plate for the housing that is to be fitted to different adapters when mounting the housing in different environments.

28. The system of claim 15 further comprising an antenna for the access point.

29. A method for protecting communications component devices in a wireless communications network comprising:

enclosing a component device in a portable housing that is substantially water-proofed;

operating the communications component device in the wireless communications network when the communications component device is enclosed in the housing;

sensing temperature in the housing when the communications component device is operating in the housing; and exchanging heat between an interior and an exterior of the housing to maintain a temperature in the housing approximately within a range of temperatures that is suitable for operating the communications component device.

30. The method of claim 29 wherein enclosing comprises enclosing the component device in an interior substantially water-proofed envelope of a case that is part of the housing.

31. The method of claim 30 wherein enclosing comprises providing an electrical connection to the interior with a substantially water-proofed conduit that is part of the housing.

32. The method of claim 30 further comprising circulating air inside the enclosure.

33. The method of claim 29 wherein sensing comprises using a sensor to sense temperature in the housing.

34. The method of claim 29 wherein the exchanging act further comprises employing a heat exchanger that is part of the housing to regulate temperature in the housing.

35. The method of claim 34 wherein employing a heat exchanger comprises using a Peltier device that is part of the heat exchanger.

36. The method of claim 29 further comprising regulating temperature in the housing to be between about 0° Celsius and about 38° Celsius.

37. The method of claim 36 wherein operating includes operating the communications component device in the housing when the housing is being exposed to temperatures that are approximately at least between about −40° Celsius and about 65° Celsius.

38. The method of claim 36 wherein operating includes operating the communications component device in the housing when the housing is being exposed to temperatures that are approximately at least between about −50° Celsius and +65° Celsius.

39. The method of claim 29 further comprising shading the housing using a heat shield.

40. The method of claim 29 further comprising substantially preventing condensation from forming in the housing.

41. The method of claim 29 further comprising providing the component device to be an access point.

* * * * *